United States Patent
Sung

(10) Patent No.: US 7,889,323 B2
(45) Date of Patent: Feb. 15, 2011

(54) WAFER STAGE AND RELATED METHOD

(75) Inventor: Min-Sang Sung, Namdong-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 656 days.

(21) Appl. No.: 11/504,623

(22) Filed: Aug. 16, 2006

(65) Prior Publication Data

US 2007/0152690 A1    Jul. 5, 2007

(30) Foreign Application Priority Data

Jan. 3, 2006    (KR) .................. 10-2006-0000652

(51) Int. Cl.
*G03B 27/60* (2006.01)
(52) U.S. Cl. .......................... 355/73; 355/72
(58) Field of Classification Search .................. 355/72, 355/73, 75, 76; 269/21
See application file for complete search history.

(56) References Cited

U.S. PATENT DOCUMENTS

| | | | | |
|---|---|---|---|---|
| 4,242,038 A * | 12/1980 | Santini et al. | ................ | 414/755 |
| 4,650,983 A * | 3/1987 | Suwa | ........................ | 250/204 |
| 5,516,367 A * | 5/1996 | Lei et al. | .................... | 118/725 |
| 5,563,683 A * | 10/1996 | Kamiya | ........................ | 355/53 |
| 6,374,512 B1 * | 4/2002 | Guo et al. | ..................... | 34/362 |
| 6,590,633 B1 * | 7/2003 | Nishi et al. | .................... | 355/53 |
| 6,710,857 B2 | 3/2004 | Kondo | | |
| 6,721,035 B1 * | 4/2004 | Segers et al. | .................. | 355/53 |
| 6,762,826 B2 * | 7/2004 | Tsukamoto et al. | .......... | 355/72 |
| 7,636,999 B2 * | 12/2009 | Choi et al. | .................... | 29/559 |
| 2002/0067585 A1 * | 6/2002 | Fujiwara | ..................... | 361/234 |
| 2002/0130276 A1 * | 9/2002 | Sogard | .................... | 250/492.2 |
| 2003/0103195 A1 * | 6/2003 | Tsuruma et al. | ............... | 355/53 |

FOREIGN PATENT DOCUMENTS

| | | | |
|---|---|---|---|
| JP | 62-0043225 | * | 10/1987 |
| JP | 2001-176956 | | 6/2001 |
| KR | 2001-0018599 | * | 3/2001 |
| KR | 1020010026929 | | 4/2001 |

OTHER PUBLICATIONS

Translation of JP 62-004325, published Jan. 10, 1987.*

* cited by examiner

*Primary Examiner*—Hung Henry Nguyen
*Assistant Examiner*—Steven H Whitesell-Gordon
(74) *Attorney, Agent, or Firm*—Volentine & Whitt, PLLC

(57) ABSTRACT

There are provided a wafer stage and methods for chucking a wafer using the same. The wafer stage includes a wafer chuck adapted to hold a wafer; lift pins adapted to pass through the wafer chuck, move vertically, and support the wafer; and an air expulsion unit adapted to expel air towards an edge of the wafer. The method for attaching a wafer to a wafer chuck comprises lowering lift pins supporting the wafer; and expelling air towards an edge of the wafer using an air expulsion unit.

10 Claims, 9 Drawing Sheets

WAFER STAGE AND RELATED METHOD

BACKGROUND OF THE INVENTION

1. Field of the Invention

Embodiments of the invention relate to a wafer stage. In particular, embodiments of the invention relate to a wafer stage adapted to hold a wafer, and a method for attaching a wafer to a wafer stage.

This application claims priority to Korean Patent Application No. 10-2006-0000652, filed on Jan. 3, 2006, the subject matter of which is hereby incorporated by reference in its entirety.

2. Description of Related Art

In general, semiconductor devices are fabricated by application of a complex sequence of fabrication processes (e.g., material deposition, etching, ashing, diffusion, photolithography, etc.) to a wafer. By means of these selectively and repeatedly applied fabrication processes, various material layers (e.g., conductive and insulating layers) are formed and patterned on the wafer.

Among the fabrication processes commonly used to manufacture semiconductor devices, photolithography processes generally comprise a coating process wherein a wafer is coated with a photoresist; an exposure process during which the coated wafer is selectively exposed to light through a reticle defining a circuit-pattern; and, a developing process during which a developing solution is applied to remove the portions of the photoresist from the wafer.

Conventional photolithography equipment adapted for use in photolithography processes may be generally divided into coating/developing equipment (e.g., a spinner) and exposure equipment (e.g., a scanner or stepper). Spinners and scanners are typically associated with one another in a fabrication line to perform photolithography processes.

Conventional exposure equipment includes a wafer stage adapted to hold a wafer. The wafer stage typically includes a wafer chuck adapted to directly hold the wafer, and a driver adapted to move (i.e., transfer) the wafer chuck.

The wafer chuck includes lift pins on a central portion of the wafer chuck, and the lift pins may be raised and lowered so that the wafer may be placed on the wafer chuck. The wafer chuck also includes a plurality of vacuum holes adapted to draw the wafer onto the wafer chuck once the wafer is positioned by operation of the lift pins.

That is, to expose a wafer coated with photoresist, for example, the wafer is first positioned over the wafer chuck by a transfer robot. The lift pins of the wafer chuck are raised to support a bottom surface of the wafer. The wafer, which is supported by the lift pins, is then positioned on a top surface of the wafer chuck as the lift pins are lowered. As soon as the lift pins have been completely lowered, the wafer is held to the wafer chuck by a vacuum suction force provided through the vacuum holes of the wafer chuck. The wafer, which is held to the wafer chuck by the vacuum suction force, is held (i.e., fixed) to the wafer chuck with a predetermined amount of pressure so that the wafer will not shake during the exposure process for forming a predetermined pattern on the wafer.

However, as illustrated in figures (FIGS.) 1A and 1B, a conventional wafer stage 10 comprises lift pins 30 disposed in a central portion of a wafer chuck 20, as described above. Thus, a wafer W, and in particular wafer W having a diameter of 300 mm, which is placed on wafer chuck 20 by lift pins 30 and held to wafer chuck 20 using vacuum holes (not shown), sags at its edge of when it is placed on wafer chuck 20 to be held by wafer chuck 20. As illustrated in FIG. 1B, wafer chuck 20 collides with the edge of wafer W when wafer W is placed on wafer chuck 20. Thus, placing wafer W on and attaching wafer W to conventional wafer stage 10 may damage the edge of wafer W. Further, when the exposure process is performed for a relatively long amount of time, a portion of wafer chuck 20 may be worn down by periodic collisions between wafer W and wafer chuck 20.

SUMMARY OF THE INVENTION

Embodiments of the invention provide a wafer stage, wherein a wafer may be attached to the wafer stage for an exposure process without substantially damaging the wafer. Embodiments of the invention also provide a method for attaching a wafer to a wafer stage for an exposure process without substantially damaging the wafer.

In one embodiment, the invention provides a wafer stage comprising a wafer chuck adapted to hold a wafer; lift pins adapted to pass through the wafer chuck, move vertically, and support the wafer; and an air expulsion unit adapted to expel air towards an edge of the wafer.

In another embodiment, the invention provides a wafer stage comprising a wafer chuck; lift pins adapted to pass through the wafer chuck, move vertically, and support the wafer; an air expulsion unit adapted to expel air towards an edge of the wafer; and a controller adapted to control when the air expulsion unit expels air towards the edge of the wafer. The wafer chuck comprises a body, a plurality of chucking protrusions disposed on an upper surface of the body and adapted to contact the wafer when the wafer is attached to the wafer chuck, and an edge ring disposed on an edge of the upper surface of the body and adapted to contact the edge of the wafer.

In yet another embodiment, the invention provides a method for attaching a wafer to a wafer chuck comprising lowering lift pins supporting the wafer, and expelling air towards an edge of the wafer using an air expulsion unit.

BRIEF DESCRIPTION OF THE DRAWINGS

Embodiments of the invention will be described herein with reference to the accompanying drawings, in which like reference symbols indicate like or similar elements. For purposes of clarity, elements in the drawings may not be drawn to scale. In the drawings.

DESCRIPTION OF EMBODIMENTS

Figure 1A:
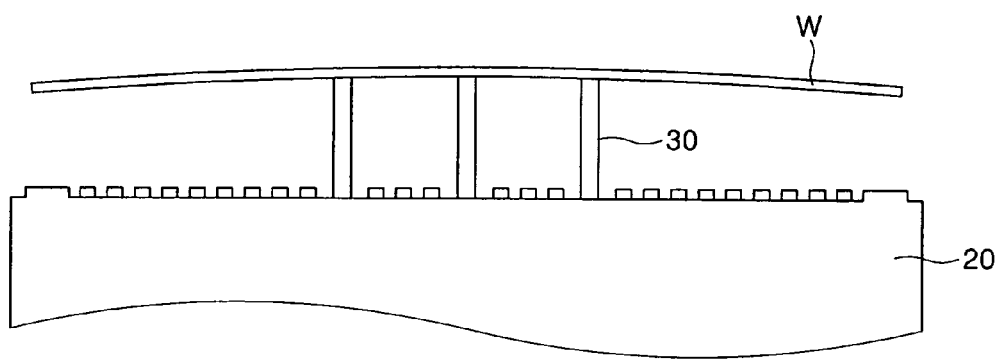
FIGS. 1A and 1B are cross-sectional views illustrating a conventional wafer chuck.
Figure 1B:
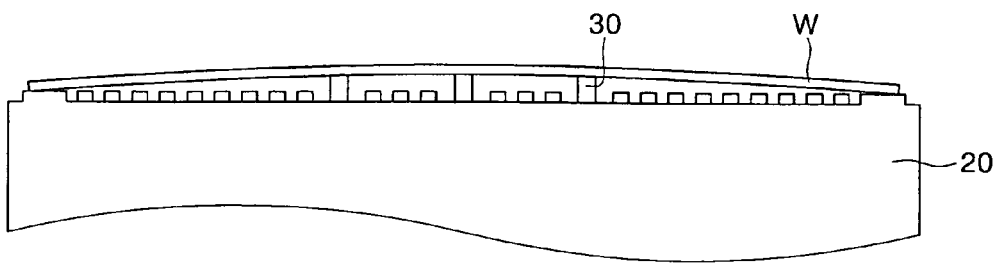
Figure 2:
FIG. 2 is a schematic view illustrating exposure equipment comprising a wafer stage in accordance with an embodiment of the invention.
Figure 2:
Figure 2:
Figure 2:
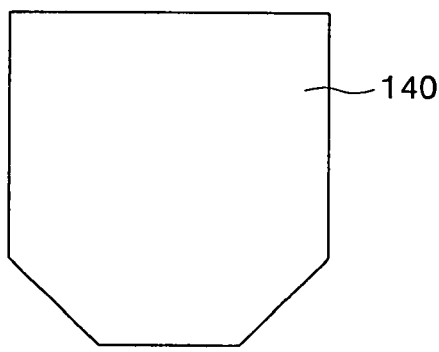
Figure 2:
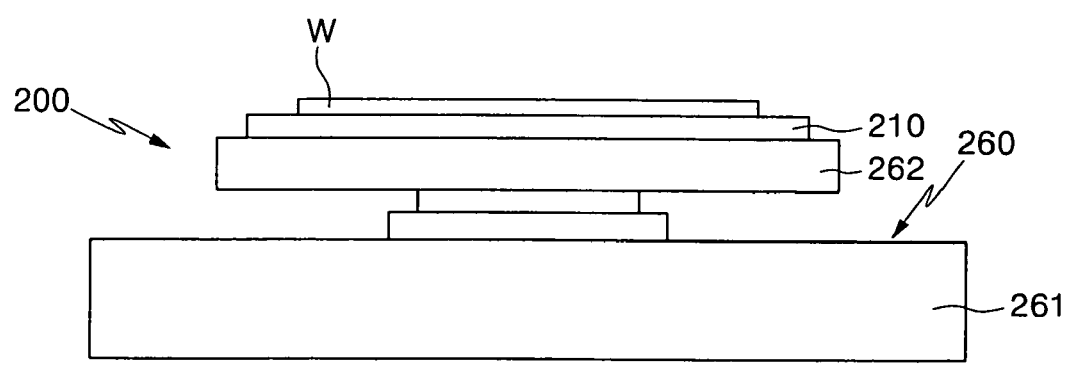

FIG. 2 is a schematic view illustrating exposure equipment comprising a wafer stage in accordance with an embodiment of the invention.

Referring to FIG. 2, exposure equipment 100 generally comprises a light source 110, a reticle R defining a circuit pattern, an optical system adapted to convey light emitted from light source 110 onto a wafer W, and a wafer stage 200 on which wafer W is attached (i.e., chucked) and which moves wafer W during the exposure process.

Light source 110 emits light having a predetermined wavelength. For example, light source 110 may emit ultraviolet light or extreme ultraviolet light.

The optical system is adapted to guide the light emitted from light source 110 towards wafer W to irradiate light onto wafer W, which is attached to wafer stage 200. In addition, the optical system is subdivided into an illumination optical system 130, which is interposed between light source 110 and reticle R, and a projection optical system 140, which is interposed between reticle R and wafer stage 200.

Illumination optical system 130 comprises a filter (not shown) that allows only a predetermined band of light emitted from light source 110 to pass through. Illumination optical system 130 also comprises a condenser lens (not shown) that condenses and irradiates onto reticle R the light filtered by the filter. Projection optical system 140 comprises a plurality of reduction projection lenses (not shown) adapted to focus light received through reticle R via illumination optical system 130 onto a predetermined portion of the wafer W.

In addition, while not shown, the optical system may be used as a reflective optical system comprising multipurpose optical lenses and reflectors.

Figure 3:
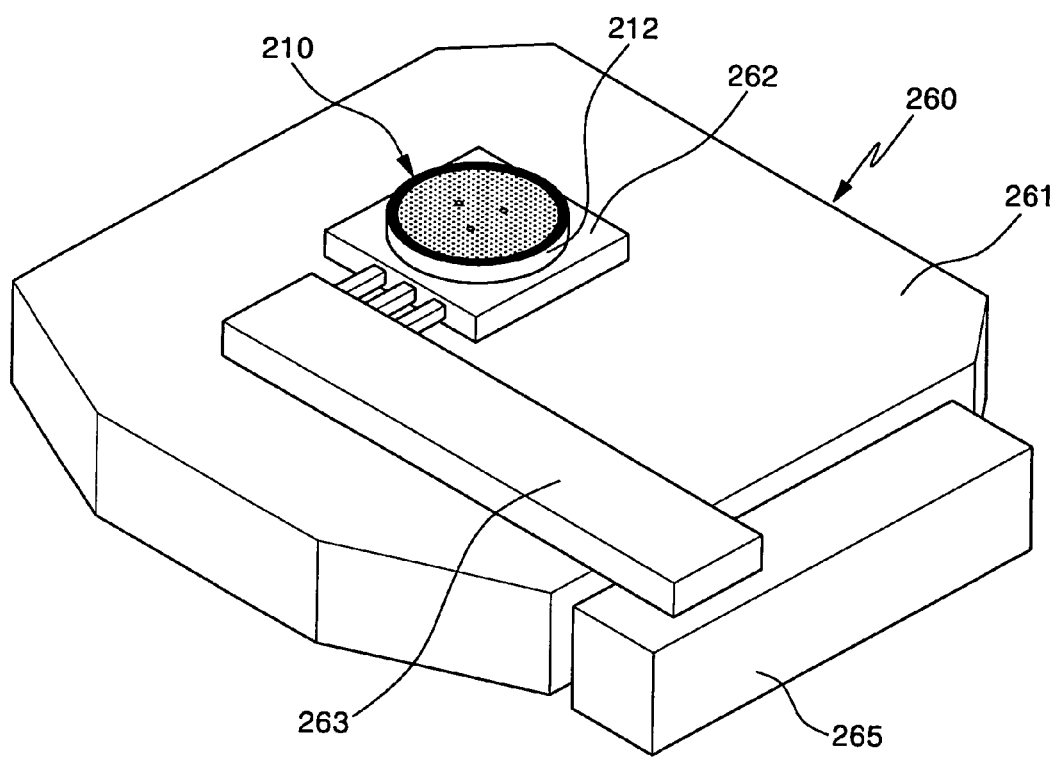
FIG. 3 is a perspective view illustrating a wafer stage in accordance with an embodiment of the invention.
Figure 4:
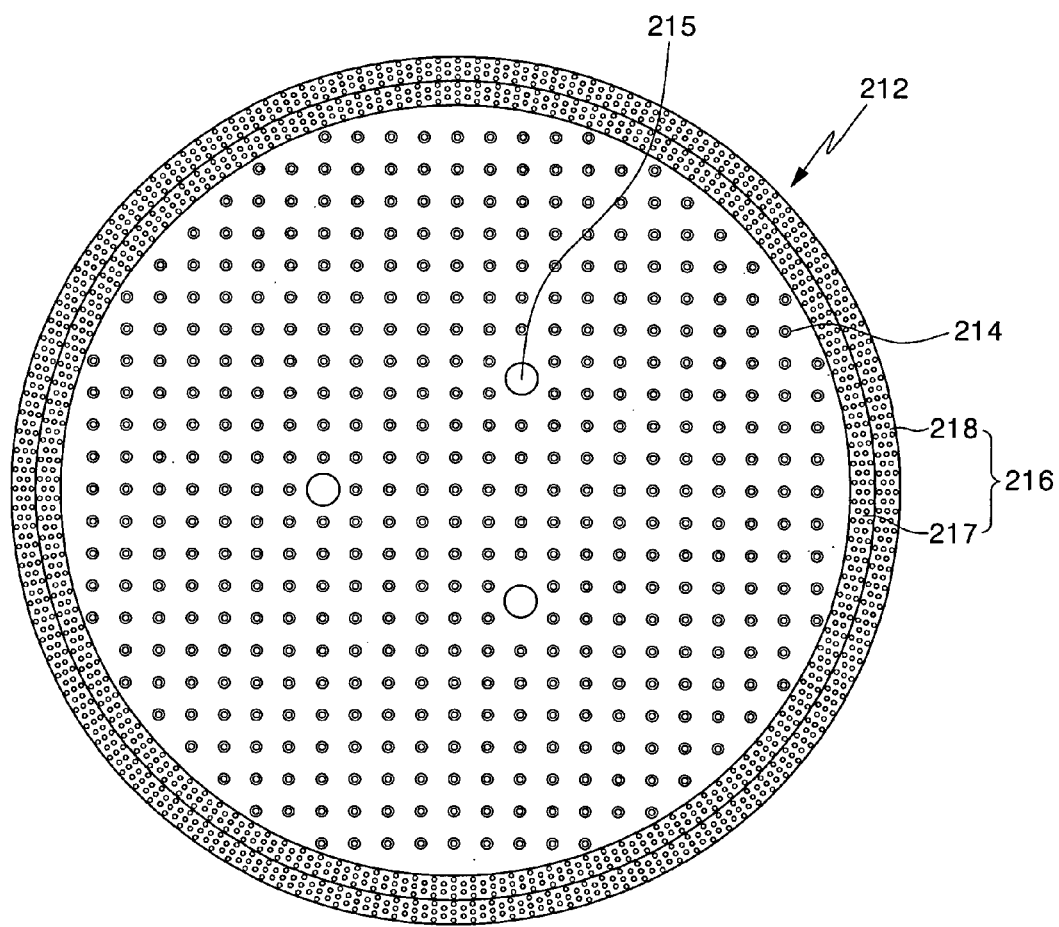
FIG. 4 is a top plan view illustrating a wafer stage in accordance with an embodiment of the invention.
Figure 5:
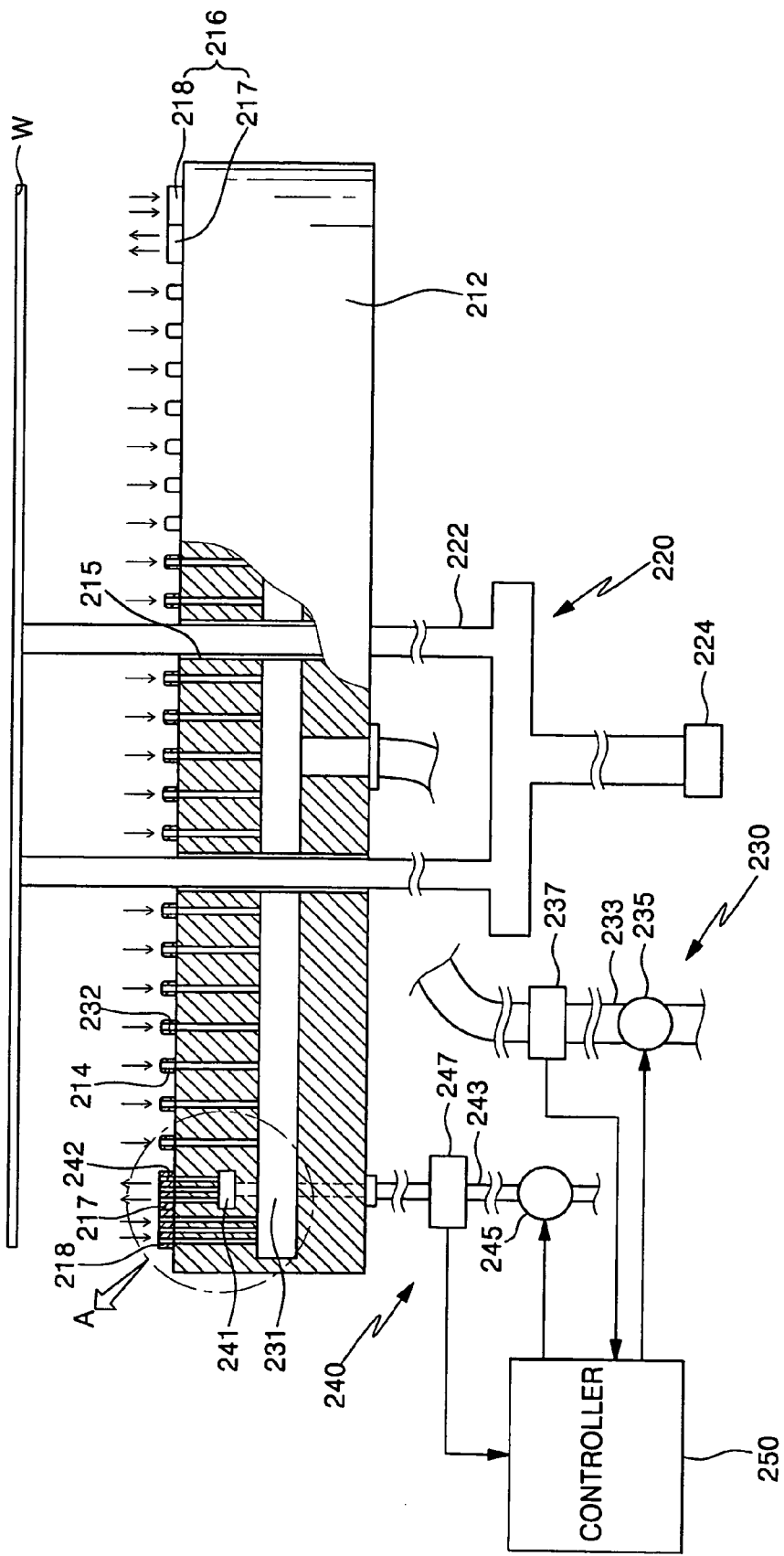
FIG. 5 shows a wafer stage in accordance with an embodiment of the invention.
Figure 6:
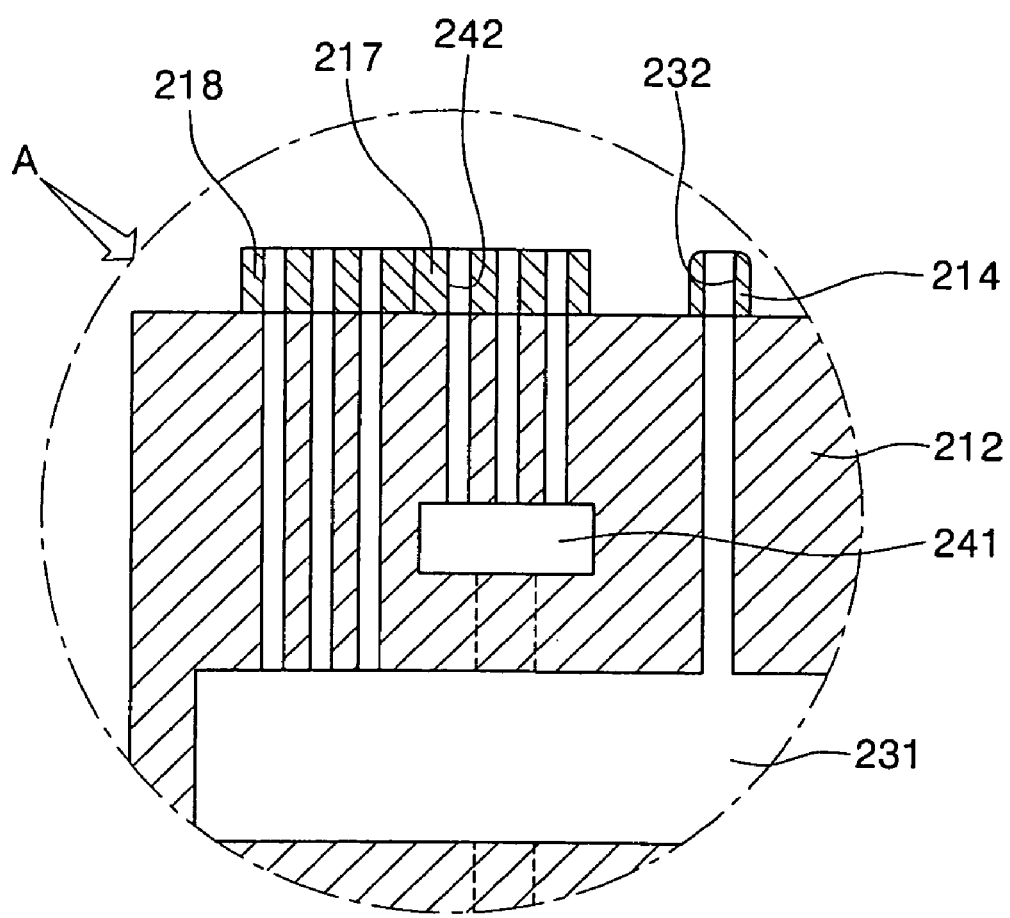
FIG. 6 is a magnified view of a circle A of FIG. 5.

FIG. 3 is a perspective view illustrating a wafer stage in accordance with an embodiment of the invention, FIG. 4 is a top plan view illustrating a wafer stage in accordance with an embodiment of the invention, FIG. 5 shows a wafer stage in accordance with an embodiment of the invention, and FIG. 6 is a magnified view of a circle A of FIG. 5.

An embodiment of a wafer stage in accordance with the invention will be described below with reference to FIGS. 3 through 6.

Wafer stage 200 comprises a wafer chuck 210 to which wafer W (of FIG. 2) is attached, and a drive unit 260 adapted to move wafer W during the exposure process. Wafer stage 200 further comprises a lift pin unit 220 disposed at a central portion of wafer chuck 210, a vacuum unit 230 adapted to pull wafer W towards wafer chuck 210 when wafer W as wafer W is placed on wafer chuck 210 and when wafer W is attached to wafer chuck 210, and an air expulsion unit 240 adapted to expel air towards wafer W, and particularly towards an edge of wafer W, when wafer W is placed on and attached to wafer chuck 210 by lift pin unit 220 and vacuum unit 230.

Additionally, wafer chuck 210 comprises a body 212, a plurality of chucking protrusions 214 disposed on an upper surface of body 212 and adapted to make contact with a bottom surface of wafer W when wafer W is placed on and attached to wafer chuck 210, and an edge ring 216 disposed along an edge of the upper surface of body 212 and adapted to make contact with an edge of the bottom surface of wafer W.

In the embodiment illustrated in FIGS. 3 through 6, body 212 has a circular disc shape, and lift pin holes 215 are disposed in a central portion of body 212 and formed such that lift pins 222 of lift pin unit 220 will fit into lift pin holes 215, respectively.

As mentioned previously, the plurality of chucking protrusions 214 are disposed on the upper surface of body 212 and are adapted to make contact with the bottom surface of wafer W when wafer W is placed on and attached to wafer chuck 210. In the embodiment illustrated in FIGS. 3 through 6, chucking protrusions 214 protrude from body 212 to a predetermined height and are integrally formed with body 212.

In addition, edge ring 216 is disposed on the edge of the upper surface of body 212 and is adapted to make contact with the edge of the bottom surface of wafer W when wafer W is placed on and attached to wafer chuck 210. In embodiment illustrated in FIGS. 3 through 6, edge ring 216 comprises of a first edge ring 218 and a second edge ring 217.

Drive unit 260 comprises a base 261 disposed beneath body 212, and also comprises drive blocks 263 and 265 adapted to move body 212, which is disposed over 261, along a two-dimensional plane (e.g., an X-Y plane). In the illustrated embodiment of FIGS. 3 through 6, a bottom side of body 212 is disposed on a mirror block 262 adapted to sense a position of body 212 disposed over base 261. Drive blocks 263 and 265 are each disposed on a respective side of body 212. Driver 263 is adapted to function as a Y-axis driver 263 adapted to move wafer W, which is attached to body 212, along a first axis (e.g., a Y-axis), and driver 265 is adapted to function as an X-axis driver 265 that is connected to Y-axial driver 263 and is adapted to move wafer W along a second axis orthogonal to the first axis (e.g., an X-axis).

Although it is not shown, coils are disposed on both sides of Y-axis driver 263, and magnets adapted to react with the coils disposed on Y-axis driver 263 are disposed on body 212 and X-axis driver 265. Accordingly, wafer W, which is attached to body 212, may be moved over base 261 in accordance with reactions between the coils and the magnets.

Lift pin unit 220 is adapted to guide wafer W onto body 212, to which wafer W will be attached. In the embodiment illustrated in FIGS. 3 through 6, lift pin unit 220 comprises lift pins 222 adapted to fit into lift pin holes 215 formed in a central region of body 212, and a lifting mechanism 224 adapted to move lift pins 222 up and down (i.e., vertically). Lifting mechanism 224 may be implemented using a hydraulic or pneumatic cylinder, or a mechanical assembly, such as a ball screw driven by a separate motor. In any practical form, lifting mechanism 224 is adapted to move wafer W up and down.

Vacuum unit 230 is adapted to pull wafer W, which is guided to body 212 by lift pins 222, using the suction generated by the vacuum (i.e., vacuum suction). Vacuum unit 230 comprises a vacuum channel 231 formed in body 212 and a plurality of vacuum holes 232 adapted to communicate with vacuum channel 231 and exposed through top surfaces of chucking protrusions 214.

In the illustrated embodiment of FIGS. 3 through 6, each of the plurality of vacuum holes 232 is exposed through the top surface of a respective chucking protrusion 214, as mentioned above, or through a top surface of first edge ring 218, which is an outer ring of edge ring 216.

Vacuum unit 230 further comprises a vacuum line 233, which is disposed partially outside of body 212 and is connected to vacuum channel 231, and a vacuum pump 235 that is connected to vacuum line 233.

The edge of wafer W, particularly when wafer W has a diameter of 300 mm, may sag when wafer W is lowered and pulled onto body 212 by lift pins 222 and vacuum unit 230. Air expulsion unit 240 is adapted to prevent the edge of wafer W from colliding with body 212 when the edge of wafer W sags.

Air expulsion unit 240 comprises an air expulsion channel 241 formed in body 212, a plurality of air expulsion holes 242 adapted to communicate with air expulsion channel 241 and exposed through an upper surface of second edge ring 217, which is the inner edge ring of edge ring 216, and an air expulsion line 243, which is disposed partially outside of body 212 and is connected to air expulsion channel 241. Air expulsion unit 240 further comprises an air expulsion pump 245 connected to air expulsion line 243.

In another embodiment, vacuum holes 232 may be disposed in second edge ring 217 rather than first edge ring 218, and air expulsion holes 242 may be disposed in first edge ring 218 rather than second edge ring 217.

Vacuum unit 230 further comprises a vacuum sensor 237 adapted to sense a vacuum suction force applied to wafer W when wafer W is being pulled towards body 212 (i.e., the force applied to wafer W by body 212).

In addition, air expulsion unit 240 further comprises a pressure sensor 247 adapted to measure an amount of air pressure applied to the edge of wafer W by air expulsion unit 240.

Wafer stage 200 further comprises a controller 250 adapted to control the process of attaching wafer W to wafer chuck 210. Controller 250 is electrically connected to vacuum pump 235, air expulsion pump 245, vacuum sensor 237, and pressure sensor 247. Controller 250 operates vacuum pump 235 to pull wafer W towards wafer chuck 210 when wafer W is being placed on wafer chuck 210. Further, controller 250 operates air expulsion pump 245 to prevent the edge of the wafer W from colliding with body 212 of wafer chuck 210 when wafer W is being placed on wafer chuck 210.

Controller 250 receives a measurement value from pressure sensor 247, which is adapted to measure the amount of air pressure applied through air expulsion holes 242, air expulsion channel 241, and air expulsion line 243, so that controller 250 can determine whether or not the air pressure is equivalent to a preset air pressure. If the measured value received from pressure sensor 247 is greater than (i.e., beyond) a preset value, controller 250 can generate an interlock to stop the process of attaching wafer W to wafer chuck 210.

Figure 7:
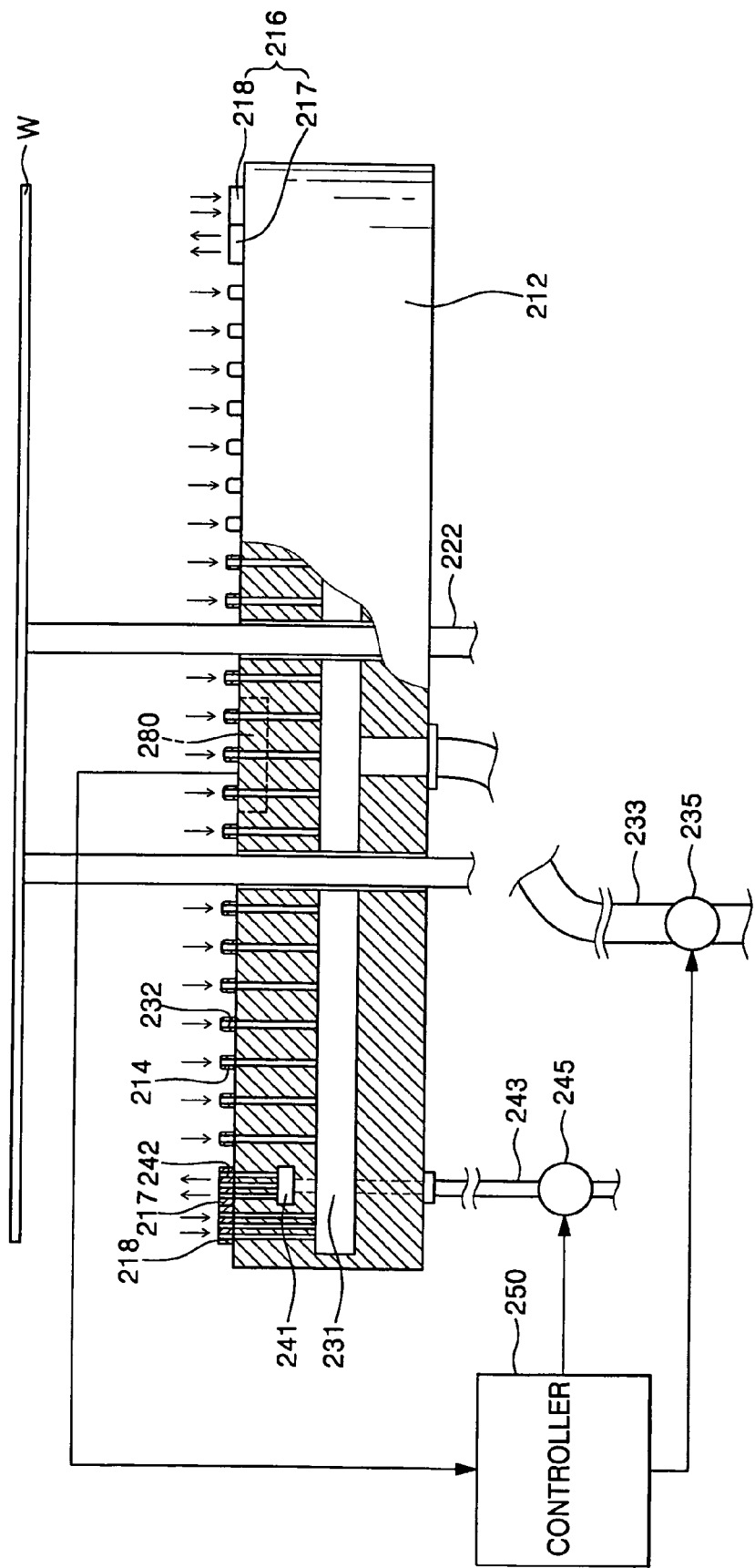
FIG. 7 illustrates the operation of the vacuum unit and the air expulsion unit of a wafer stage in accordance with another embodiment of the invention.

FIG. 7 illustrates another embodiment of a wafer stage in accordance with the invention. Referring to FIG. 7, a position sensor 280 is disposed at an upper portion of wafer chuck 210 and is adapted to sense when wafer W has reached wafer chuck 210. In the embodiment illustrated in FIG. 7, the upper surface of position sensor 280 is preferably lower than the upper surfaces of chucking protrusions 214 and lower than the upper portion of edge ring 216 so that position sensor 280 does not hinder wafer W from being attached to wafer chuck 210. Although it is not shown, a plurality of position sensors 280 may be disposed on one side of the upper portion of wafer chuck 210.

Position sensor 280 may be an optical sensor comprising a light emitting element adapted to emit light towards wafer W, which is lowered by lift pins 222, and a light receiving element adapted to receive light reflected by wafer W. Alternatively, position sensor 280 may be a proximity sensor.

In addition, position sensor 280 is electrically connected to controller 250. Thus, controller 250 can determine when air should be expelled towards the edge of wafer W in accordance with the position of wafer W as sensed by position sensor 280.

A method for attaching a wafer to a wafer stage, in accordance with an embodiment of the invention, wherein the method uses a wafer stage in accordance with an embodiment of the invention, will now be described with reference to the accompanying drawings.

Figure 8:
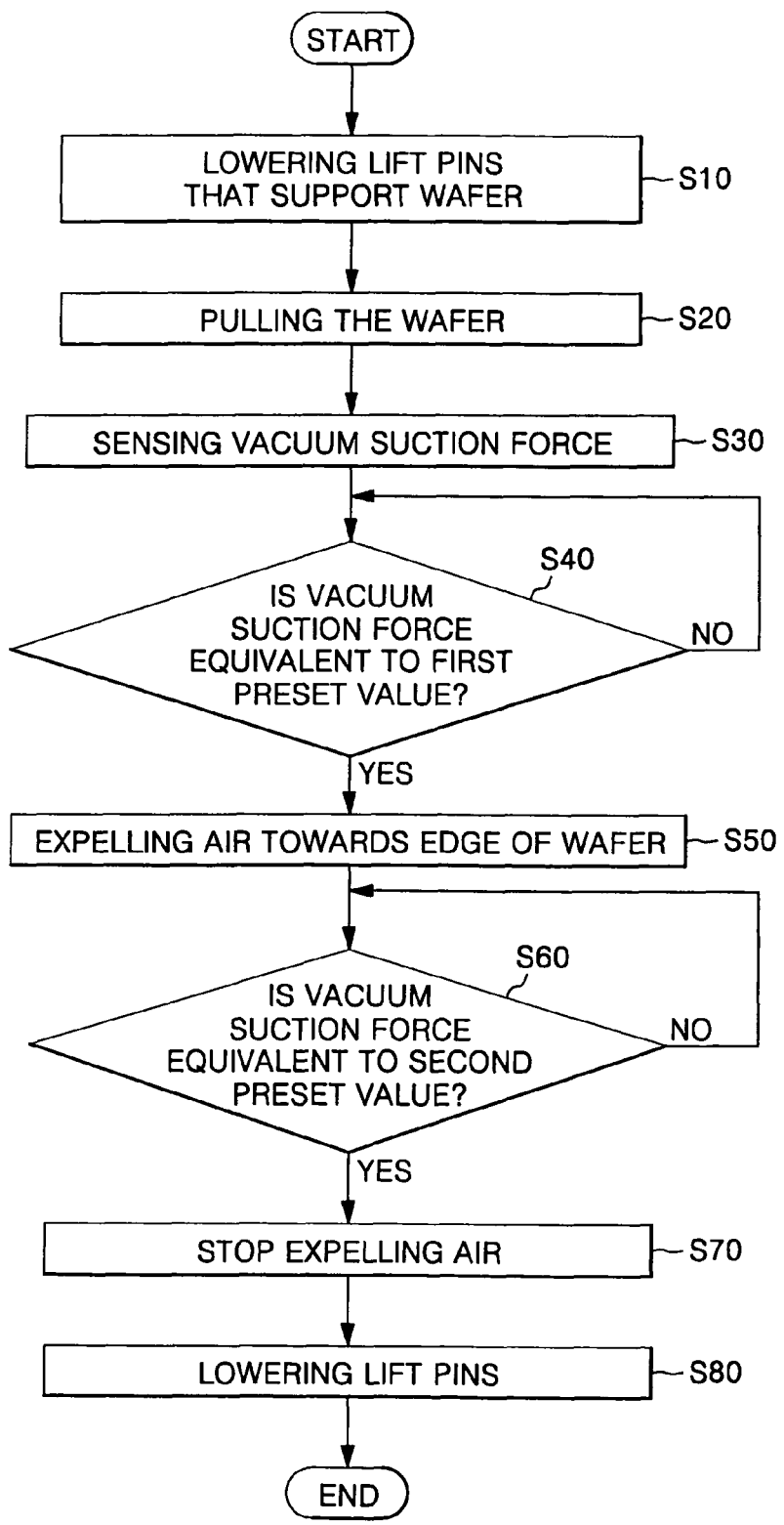
FIG. 8 is a flowchart illustrating a method for attaching a wafer to a wafer stage in accordance with an embodiment of the invention; and, FIG. 9 is a flowchart illustrating a method for attaching a wafer to a wafer stage in accordance with another embodiment of the invention.

Referring to FIG. 8, to attach wafer W to wafer stage 200 for the exposure process, wafer W, which is coated with a photoresist layer, is first positioned (i.e., transferred) over body 212 by a transfer robot (not shown). When the positioning of wafer W is completed (i.e., when wafer W has been moved over body 212), lift pins 222 are raised to support the bottom surface of wafer W. Then, lift pins 222 are lowered to guide wafer W to body 212 (S10).

When lifting mechanism 224 begins to lower lift pins 222, controller 250 operates vacuum unit 230. Specifically, controller 250 operates vacuum pump 235 to generate a vacuum suction force and exert the vacuum suction force on wafer W through body 212, and more specifically, through vacuum line 233, vacuum channel 231, and vacuum holes 232. Thus, wafer W, which is guided to body 212 by lift pins 222, is pulled towards the upper surface of body 212 in accordance with the vacuum suction force exerted by vacuum unit 230 (S20).

Controller 250 then continues to sense the vacuum suction force, which is exerted on wafer W by vacuum unit 230, using vacuum sensor 237 (S30).

Vacuum sensor 237 then checks whether or not the vacuum suction force by which wafer W is being pulled towards body 212 has reached a first preset value, that is, whether or not wafer W has reached a first preset position (S40). The first preset position is a position at which the vacuum suction force generated by vacuum unit 230 and applied to wafer W has a first preset value.

If the vacuum suction force by which wafer W is being pulled towards body 212 by vacuum unit 230 has reached the first preset value, air expulsion unit 240 expels air towards the edge of wafer W (S50). That is, if wafer W has reached the first preset position, vacuum sensor 237 sends a signal to controller 250, and controller 250 then operates air expulsion pump 245 to expel air towards the edge of wafer W. In contrast, when wafer W has not reached the first preset position, controller 250 continuously checks whether wafer W has reached the first preset position. By expelling air towards the edge of wafer W as described above, wafer W is substantially prevented from sagging when wafer W is guided by lift pins 222.

Then, controller 250 checks whether or not the vacuum suction force by which wafer W is being pulled by vacuum unit 230 has reached a second preset value, that is, whether or not wafer W has reached a second preset position (S60). The second preset position is a position at which the vacuum suction force generated by vacuum unit 230 and applied to wafer W has a second preset value.

If the vacuum suction force has reached the second preset value, air expulsion unit 240 stops expelling air towards the edge of wafer W (S70). In other words, if wafer W has reached the second preset position, vacuum sensor 237 sends a signal to controller 250, and controller 250 then stops operating air expulsion pump 245. In contrast, if the vacuum suction force by which wafer W is pulled has not reached the second preset value, air expulsion unit 240 continues to expel towards the edge of wafer W. Air expulsion unit 240 stops expelling air towards the edge of wafer W when the vacuum suction force has reached the second preset value because expelling air towards wafer W has no effect on wafer W as wafer W comes near to body 212.

Thereafter, wafer W is placed on and attached to body 212 by continuously lowering lift pins 222 (S80).

Figure 9:
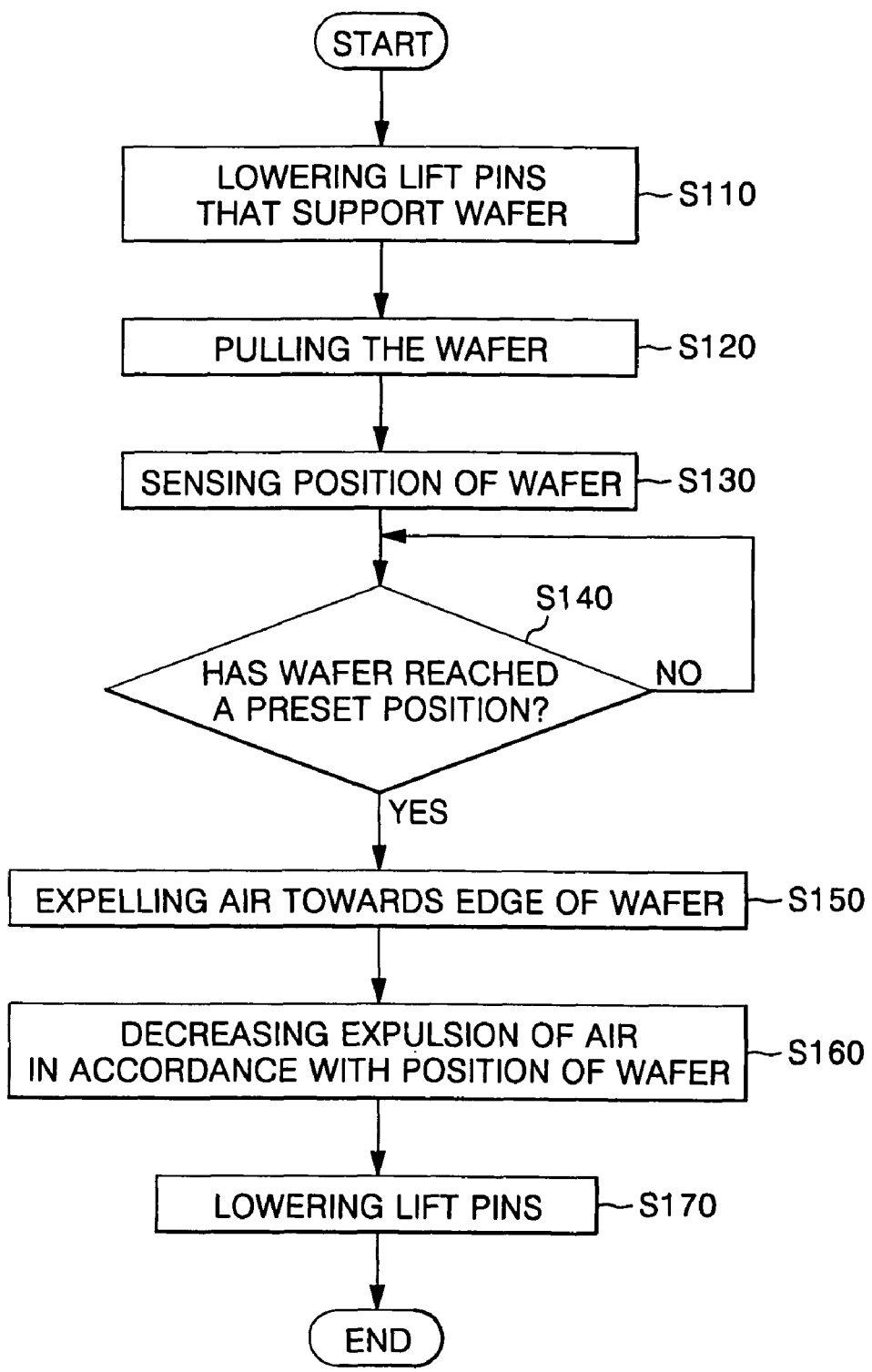

As shown in FIG. 9, the expulsion of air towards the edge of wafer W can alternatively be controlled in accordance with the output of position sensor 280, i.e., the position of wafer W.

FIG. 9 is a flowchart illustrating a method for attaching a wafer to a wafer stage in accordance with another embodiment of the invention.

Referring to FIG. 9, to attach wafer W to wafer stage 200 to perform the exposure process, wafer W, which is coated with a photoresist layer, is first positioned (i.e., transferred) over body 212 by a transfer robot (not shown). When the positioning of wafer W is completed, lift pins 222 are raised to support the bottom surface of wafer W. Then, lift pins 222 are lowered to guide wafer W to body 212 (S110).

When lifting mechanism 224 begins to lower lift pins 222, controller 250 operates vacuum unit 230. Specifically, controller 250 operates vacuum pump 235 to generate a vacuum suction force and exert the vacuum suction force on wafer W through body 212, and more specifically, through vacuum line 233, vacuum channel 231, and vacuum holes 232. Thus, wafer W, which is guided to body 212 by lift pins 222, is pulled towards the upper surface of body 212 in accordance with the vacuum suction force exerted by vacuum unit 230 (S120).

Then, while wafer W is lowered by lift pins 222, position sensor 280 continually senses a position of wafer W (S130). Position sensor 280 continues to sense the position of wafer W until wafer W is placed on and attached to body 212.

Position sensor 280 senses whether or not wafer W, which is being lowered, has reached a preset position (S140). If wafer W has reached the preset position, position sensor 280 sends an electrical signal to controller 250. In response, controller 250 operates air expulsion pump 245 such that it begins expelling air towards the edge of wafer W (S150).

While wafer W is being lowered by lift pins 222 as air is being expelled towards the edge of wafer W, controller 250 gradually decreases the pressure with which air is expelled towards the edge of wafer W in accordance with the position of wafer W, which is measured by position sensor 280 (S160).

Thereafter, wafer W is placed on and attached to body 212 by continuously lowering lift pins 222 (S170). The pressure with which the air is expelled by air expulsion unit 240 decreases in accordance with the position of wafer W, which is measured by position sensor 280, and air expulsion unit 240 is adapted to stop expelling air once wafer W is disposed on body 212.

As stated above, the wafer stage, in accordance with embodiments of the invention, is adapted to expel air towards the edge of a wafer during the process of attaching the wafer to the wafer stage in order to prevent the wafer from being damaged by a collision between the edge of the wafer and the wafer chuck. In addition, the method for attaching the wafer to the wafer stage, in accordance with embodiments of the invention, comprises expelling air towards the edge of a wafer during the process of attaching the wafer to the wafer stage in order to prevent the wafer from being damaged by a collision between the edge of the wafer and the wafer chuck.

While embodiments of the invention have been shown and described herein, it will be understood by those of ordinary skill in the art that various changes in form and detail may be made to the embodiments without departing from the scope of the invention as defined by the accompanying claims.

What is claimed is:

1. A wafer stage comprising:
    a wafer chuck adapted to hold a wafer during a fabrication process, the wafer chuck comprising
        a body,
        a plurality of chucking protrusions disposed on a central portion of an upper surface of the body and adapted to contact the wafer when the wafer is seated on the wafer chuck, and
        an outer edge ring comprising concentrically disposed first and second edge rings disposed on the upper surface of the body and adapted to contact an outer edge of the wafer;
    lift pins adapted to pass through the wafer chuck, move vertically, and support the wafer as the wafer is placed on the wafer chuck during a wafer loading operation before the fabrication process, and as the wafer is removed from the wafer chuck during a wafer unloading operation after the fabrication process;
    a vacuum unit adapted to apply suction to a first portion of the outer edge of the wafer through a plurality of vacuum holes formed through the first edge ring to seat the wafer on the wafer chuck;
    an air expulsion unit adapted to expel air towards a second portion of the outer edge of the wafer through a plurality of air expulsion holes formed in the second edge ring to prevent the wafer from sagging during the wafer loading operation; and
    a controller adapted to control operation of the air expulsion unit such that air is expelled towards the second portion of the outer edge of the wafer only after suction is applied to the first portion of the outer edge of the wafer, and such that suction on the first portion of the outer edge of the wafer and expulsion of air towards the second portion of the outer edge of the wafer are coincidently applied during the wafer loading operation.

2. The wafer stage of claim 1, wherein the air expulsion unit comprises:
    an air expulsion channel fully disposed within the wafer chuck and connected to the plurality of air expulsion holes;
    an air expulsion line connected to the air expulsion channel and disposed partially outside of the wafer chuck; and,
    an air expulsion pump connected to the air expulsion line, wherein the air expelled through the plurality of air expulsion holes creates an upward pressure on the second portion of the outer edge of the wafer.

3. The wafer stage of claim 2, wherein the air expulsion unit further comprises a pressure sensor adapted to measure an amount of air pressure applied to the second portion of the outer edge of the wafer by the air expulsion unit.

4. The wafer stage of claim 1, wherein the vacuum unit comprises:
    a vacuum channel fully disposed within the body;
    an additional plurality of vacuum holes adapted to communicate with the vacuum channel and exposed through top surfaces of the chucking protrusions;
    a vacuum line disposed partially outside of the body and connected to the vacuum channel; and,
    a vacuum pump connected to the vacuum line.

5. The wafer stage of claim 4, wherein the vacuum unit further comprises a vacuum sensor adapted to sense a vacuum suction force applied to the wafer through the vacuum pump.

6. The wafer stage of claim 5, wherein the controller is further adapted to control operation of the vacuum pump, and the vacuum sensor.

7. The wafer stage of claim 1, further comprising a position sensor adapted to sense a position of the wafer relative to the wafer chuck during the wafer loading and wafer unloading operations.

8. The wafer stage of claim 7, wherein the position sensor is an optical sensor adapted to emit light to the wafer and adapted to receive light reflected by the wafer.

9. The wafer stage of claim 7, wherein the position sensor is a proximity sensor adapted to sense the position of the wafer and adapted to receive light reflected by the wafer.

10. The wafer stage of claim 7, wherein the controller is electrically connected to the position sensor and is further adapted to control operation of the air expulsion unit in relation to the position of the wafer as sensed by the position sensor.

* * * * *